United States Patent [19]

Fuse

[11] Patent Number: 4,476,480
[45] Date of Patent: Oct. 9, 1984

[54] HIGH WITHSTAND VOLTAGE STRUCTURE OF A SEMICONDUCTOR INTEGRATED CIRCUIT

[75] Inventor: Mamoru Fuse, Tokyo, Japan

[73] Assignee: Nippon Electric Co., Ltd., Tokyo, Japan

[21] Appl. No.: 288,450

[22] Filed: Jul. 30, 1981

[30] Foreign Application Priority Data

Jul. 30, 1980 [JP] Japan .................. 55-104514

[51] Int. Cl.³ .................. H01L 27/02; H01L 27/04
[52] U.S. Cl. .................. 357/44; 357/48; 357/89
[58] Field of Search ............... 357/44, 48, 89

[56] References Cited

U.S. PATENT DOCUMENTS

| | | | |
|---|---|---|---|
| 3,648,128 | 3/1972 | Kobayashi | 357/48 |
| 3,702,428 | 11/1972 | Schmitz et al. | 357/44 |
| 4,038,680 | 7/1977 | Yagi et al. | 357/44 |
| 4,087,900 | 5/1978 | Yiannoulos | 357/48 |

OTHER PUBLICATIONS

Chang et al. "Fabrication of PNP and NPN Transistors in a Single Wafer or Chip" IBM Tech. Disclosure Bulletin vol. 11 (5/69) pp. 1653-1654.

Primary Examiner—Gene M. Munson
Attorney, Agent, or Firm—Sughrue, Mion, Zinn, Macpeak, and Seas

[57] ABSTRACT

A vertical PNP transistor having a large withstand voltage is disclosed. On a P-type substrate, a N-type epitaxial layer is provided. A P-type isolation region is formed in the epitaxial layer as a closed-loop to isolate a portion of the epitaxial layer from the other portions thereof. A first N-type buried layer is formed in the isolated epitaxial layer at the interface of the epitaxial layer and the semiconductor layer so as to separate the two. A second P-type buried layer is provided on top of the first buried layer. A P-type collector region is formed as a second closed-loop in the epitaxial layer enclosed within the first closed-loop. A high N-type concentration region that permits great withstand voltage is formed as a closed-loop separating the first closed-loop and the second closed-loop regions. A P-type emitter region is formed in the epitaxial layer region enclosed within the second closed-loop. Without the emitter region, the device can be used as a diode. By adding a N-type region within the emitter region, an NPNP thyristor can be obtained.

7 Claims, 3 Drawing Figures

U.S. Patent  Oct. 9, 1984  4,476,480

HIGH WITHSTAND VOLTAGE STRUCTURE OF A SEMICONDUCTOR INTEGRATED CIRCUIT

BACKGROUND OF THE INVENTION

This invention relates to a structure of a semiconductor integrated circuit and more particularly, to a structure of a vertical PNP transistor whose "withstand voltage" has conventionally been low. The term "withstand voltage" is defined for purposes herein as the maximum voltage at the collector relative to the substrate which does not create a state of punchthrough between the collector and the substrate of the integrated circuit.

A semiconductor integrated circuit is generally fabricated by the steps of forming an N-type silicon epitaxial layer on a P-type silicon substrate by vapor deposition techniques, dividing this N-type silicon epitaxial layer into plural island regions electrically isolated from one another by a P-type isolation region and forming transistors and resistors in the island regions. An NPN transistor is easy to fabricate in the N-type island region, with excellent electric characteristics, because its base and emitter can be formed by effecting impurity diffusion twice, but a PNP transistor is not so easy to fabricate.

The so-called lateral PNP transistor and vertical PNP transistor are known as the PNP structures for use in the semiconductor integrated circuit. The lateral PNP transistor is disclosed in U.S. Pat. No. 3,197,710 granted to H. C. Lin and is fabricated by forming two P-type regions spaced apart from each other in the lateral direction in one island region of an N-type epitaxial layer, wherein the P-type regions are used as the emitter and collector, respectively, with the N-type epitaxial layer as the base. The lateral PNP transistor of this type is extremely simple to fabricate but has the disadvantages that the current gain ($h_{FE}$) is extremely small as compared with that of the ordinary NPN transistor, and the gain bandwidth product ($f_T$) is low, and a current is likely to flow through the substrate due to parasitic current effects.

A vertical PNP transistor improves upon the abovementioned drawbacks. A vertcial PNP transistor is disclosed in U.S. Pat. No. 3,702,428 granted to A. Schmitz. According to this prior art, an N+ buried layer and a P+ buried layer are sequentially formed on a P-type silicon substrate and an N-type epitaxial layer is further formed thereon. In this instance, each buried layer extends into the N-type epitaxial layer by diffusion. Thereafter, a close-loop or an annular encompassing P-type region which will serve as a collector in cooperation with the P+ buried layer is formed on the N-type epitaxial layer by diffusion techniques. The term annular region is used hereinafter to mean a region encompassing a closed loop and enclosing a region within the closed loop. At the same time, a P+-type isolation region is formed together with the annular P-type region, so as to reach the P-type silicon substrate and thus to isolate the N-type epitaxial layer into plural island regions. The annular P+-type region which is to serve as the collector is allowed to reach the extending portion of the P-type buried layer, thereby isolating the N-type epitaxial layer on the P+-type buried region from the other portions. Thereafter, a P-type region, to serve as an emitter, is diffused into the N-type epitaxial layer on the P-type buried layer. The N-type epitaxial layer on the P-type buried layer serves as the base.

In the abovementioned vertical PNP transistor, the minor carriers which are injected from the emitter to the base and arrive at the collector are more than those in a lateral PNP transistor so that the current gain is greater than that in a lateral PNP transistor. Furthermore, since the base width can be reduced in comparison with that in a lateral PNP transistor, the gain bandwidth product ($f_T$) can also be increased. However, the vertical PNP transistor is not devoid of problems in that the structure is complicated and the area occupied by the element is great. The area occupied by the element can be reduced only at the expense of the "withstand voltage" between the collector and the P-type substrate.

Next, the relation between the area occupied by the transistor element and the "withstand voltage" between the collector and the P-type substrate will be described.

In the vertical PNP transistor, the impurity concentration of the base is lower than that of the collector so that the depletion layer at the base-collector junction extends towards the base region. In order to sufficiently increase the base-collector withstand voltage, therefore, the base width must be sufficiently increased, but this results in an increase in the width of the N-type epitaxial layer. In order to form the P-type isolation region and the annular P-type region in such a manner as to reach the P-type substrate or the extending portion of the P+-type buried layer through this thick N-type epitaxial layer, providing impurity diffusion in a high concentration for an extended period of time is inevitable. Accordingly, expansion in the lateral direction becomes greater on the surfaces of the P-type isolation region and the annular P+-type region and they would come into contact with each other unless a sufficient gap is provided in advance. When each buried layer extends into the N-type epitaxial layer, it does not swell up straight but slants considerably. Hence, this direction of swelling direction must be taken into account in separating the P+-type isolation region from the P+-type buried layer, otherwise they would come into contact with each other and the collector would become conductive with the P-type substrate.

In order to avoid possible contact between each region, the gap must be provided to be sufficiently great between the P+-type isolation region and the annular P+-type region. This results in a large area occupied by the transistor element. In order to avoid contact of each region and at the same time to reduce the occupying area of the element, the withstand voltage between the collector and the substrate must be sacrificed. In other words, the gap between the P+-type isolation region and the annular P+-type region must be as narrow as possible and the gap between the P+-type isolation region and the P+-type buried region must also be as narrow as possible. In this instance, the depletion layer of the PN junction between the annular P+-type region and the N-type epitaxial layer around the outer circumference of the former expands into the N-type epitaxial layer. Since the impurity concentration of the N-type epitaxial layer is low, the depletion layer reaches the P+-type isolation region at a low collector voltage, the result being occurrence of punch-through between the annular P+-type region and P+-type isolation region.

Thus, inspite of its advantage of a great current gain, the conventional vertical PNP transistor inherently involves the drawback that it occupies a large area and the withstand voltage between the collector and the substrate is low.

SUMMARY OF THE INVENTION

It is an object of the present invention to obtain a structure for use in a semiconductor integrated circuit occupying a small area and having a great withstand voltage.

It is another object of the present invention to obtain a transistor of a vertical structure type occuping a area but having a great withstand voltage with respect to the substrate potential by use of double buried layers.

In accordance with the present invention, there is provided a semiconductor device which comprises a semiconductor substrate of one conductivity type; a semiconductor layer of the other conductivity type formed on the semiconductor substrate; an isolation region of one conductivity type so formed as to penetrate through the semiconductor layer to reach the semiconductor substrate and to divide the semiconductor layer into plural island regions; a first buried layer of the other conductivity type formed in the proximity of the interface between one of the island regions and the semiconductor substrate; a second buried layer of one conductivity type formed in the proximity of the interface between the first buried layer and the one island region; and annular region of one conductivity type so formed as to reach the second buried layer from the surface of the semiconductor layer and to isolate the semiconductor layer on the second buried layer from the other regions; and a high concentration region of the other conductivity type formed on the semiconductor layer between the isolation region and the annular region of one conductivity type so as to reach the first buried layer from the surface of the semiconductor layer, whereby the second buried layer, the annular region of one conductivity type and the semiconductor layer on the second buried layer are included in a circuit element for an integrated circuit.

When the circuit element for the semiconductor integrated circuit is a diode, the second buried layer and the annular region of one conductivity type serve as one of the electrodes and the semiconductor layer on the second buried layer serves as the other electrode. When the circuit element is a transistor, the second buried layer and the annular region of one conductor type serve as the collector or emitter (preferably, as the collector) and the semiconductor layer on the second buried layer serves as the base while an additional region of one conductivity type to be further formed on the semiconductor layer on the second buried layer serves as the emitter or collector (preferably, as the emitter).

In accordance with the present invention, the high concentration region of the other conductivity type exists between the isolation region and the annular region of one conductivity type, so that the isolation region and the annular region can be isolated from each other in a reliable manner even when the gap between them is reduced. Extention of the depletion layer extending from the PN junction on the outer circumference of the annular region of one conductivity type can be suppressed by the high concentration region of the other conductivity type. For this reason, the annular region of one conductivity type and the isolation region do not easily cause punch-through and the withstand voltage between them can be enhanced. When the annular region of one conductivity type and the high concentration region of the other conductivity type overlap each other, this withstand voltage is determined by the withstand voltage at this junction but it is by far higher than a punch-through voltage between the annular region of one conductivity type and the isolation region in the case where the high concentration region of the other conductivity type does not exist.

In the conventional device, the surface impurity concentration is low on the surface of the semiconductor layer between the annular region of one conductivity type and the isolation region and hence, an inversion channel is easily formed on that portion, thereby rendering both regions conductive to each other. In accordance with the present invention, however, the inversion channel is prevented by the high concentration region of the other conductivity type from rendering both of the above-mentioned regions conductive to each other.

BRIEF DESCRIPTION OF THE DRAWINGS

The above and further objects, features and advantages of the present invention will become more apparent from the following detailed description taken in conjunction with the accompanying drawings, in which.

DESCRIPTION OF THE PREFERRED EMBODIMENTS

Figure 1:
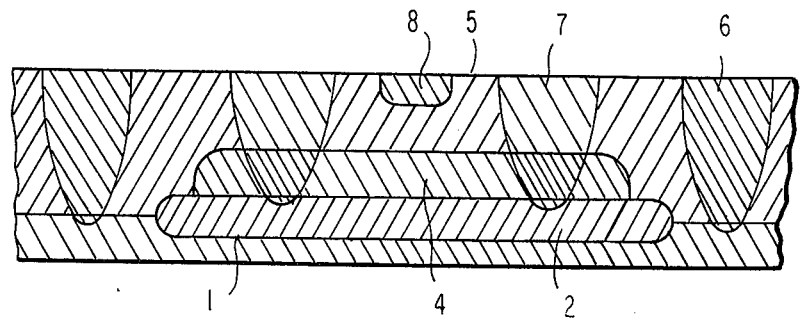
FIGS. 1 and 2 are sectional views, each showing a conventional vertical PNP transistor.

In FIG. 1, there is shown a conventional vertical PNP transistor. An N+ buried layer is formed on a PNP transistor-forming region of a P-type substrate 1, and then a P+ buried layer is formed in this N+ buried layer. An N type epitaxial layer 5 is thereafter formed on the surface by vapor deposition techniques. During this vapor growth process, the impurity of each buried layer rises into the epitaxial layer 5, thereby forming an N+ buried layer 2 and a P+ buried layer 4 as shown in the drawing.

Next, a P-type isolation region 6 for isolating the epitaxial layer 5 into plural island regions is formed by diffusing an impurity from the surface of the epitaxial layer 5 so as to reach the P-type substrate 1. Simultaneously with the diffusion process for this P-type isolation region 6, a P-type wall region 7 to serve as the collector of the PNP transistor is formed by diffusing an impurity from the surface of the epitaxial layer 5 so as to reach the P+ buried layer 4. The P-type wall region 7 is shaped in a closed-loop, i.e. annular shape in such a manner as to isolate the region of the epitaxial layer 5, in cooperation with the P+ buried layer 4 thereinside, from the other regions. A P-type emitter region 8 is then diffused in the portion of the epitaxial layer 5 which is encompassed by the P-type wall region 7.

The PNP transistor thus obtained has the P-type region 8 serving as the emitter, the portion of the epitaxial layer 5 encompassed by the wall region 7 serving as the base, and the wall region and the P+ buried layer 4 serving as the collector. For this structure, the PNP transistor is generally referred to as the "vertical PNP transistor".

In the vertical PNP transistor, the depletion layer of the basecollector junction spreads over the epitaxial layer on the P+ buried region 4. In order to increase the emitter-collector withstand voltage of this vertical PNP transistor, it is therefore necessary to increase the thickness of this epitaxial layer 5. If the epitaxial layer 5 has an increased thickness, impurity diffusion treatment at high temperature for an extended period of time becomes necessary in order to form the P-type isolation region 6 and the P-type wall region 7 by a single diffusion process, and is likely to cause a large number of crystal defects. In addition, diffusion of the impurity in the lateral direction proceeds in the regions in which the impurity has already been diffused, and the surface area becomes greater for each of the P-type isolation region 6 and the P-type wall region 7. For this reason, it has not been possible to reduce the size of the semiconductor element.

Figure 2:
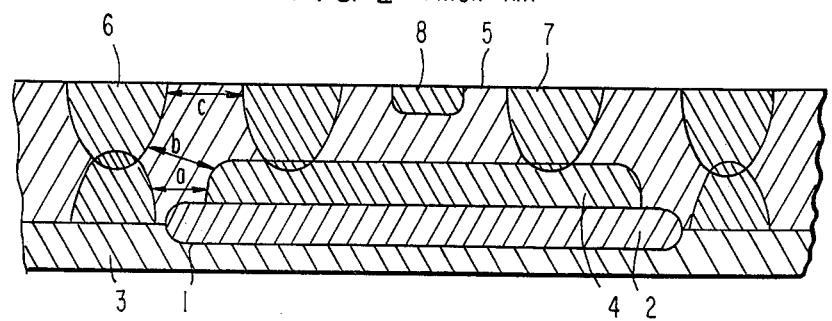

A so-called "Double Isolation" structure has been proposed to avoid this impurity diffusion treatment at high temperature for an extended period of time. In accordance with this "Double Isolation" structure, a P+ buried layer is advance in the portion of a P-type substrate 1 at which an isolation region 6 is to be formed this P+ layer is in addition to the N+ and the P+ buried layers, as shown in FIG. 2. Then an N-type epitaxial layer 5 is formed, followed thereafter by the same procedures as in FIG. 1. This P+ buried layer rises during the formation process of the epitaxial layer 5 and subsequent various heat-treatments and is thus converted into the P+ buried layer 3 as shown in FIG. 2. The P-type isolation region 6 and the P-type wall region 7 are simultaneously formed by a single diffusion process. In this instance, the P-type isolation region 6 may be formed to such a depth as to come into contact with the P+ buried layer 3 and it need not penetrate through the epitaxial layer 5. Accordingly, the diffusion process for forming the P-type isolation region 6 or the like can be effected at a relatively low temperature for a short period of time.

However, in the above "Double Isolation" structure, it is necessary to provide heat-treatment at 1200° C. for about 20 hours. Due to this heat-treatment, the length of each of the isolation region 6 and the P-type wall region 7 increases in the lateral direction. Namely, when the thickness of the epitaxial layer 5 is increased from 25 to 30$\mu$, the width of the P-type isolation region 6 on the surface of the epitaxial layer 5 is 10$\mu$ and that of the P-type wall region 7 on the surface of the epitaxial layer 5 is likewise 10$\mu$. The P-type isolation region 6 and the P-type wall region 7 become closest to each other on the surface of the epitaxial layer 5, and if the gap at this portion is too narrow, the depletion layer at the junction between the P-type wall region 7 and the epitaxial layer 5 outside the wall region 7 spreads towards and reaches the P-type isolation regions 6, thus allowing a punch-through between them. Hence, the voltage that can be applied between the P-type wall region 7 and the substrate 1 becomes extremely small. In order to apply a sufficient voltage to the P-type wall region 7, the gap c between the P-type isolation region 6 and the P-type wall region 7 on the surface of the epitaxial layer 5 must be at least 45$\mu$ in consideration an allowance for the manufacturing error.

Similarly, gap a between the P+ layers 3 and 4 becomes narrowest at the lower portion of the epitaxial layer 5. In order to increase a punch-through voltage at this portion, a gap a of at least 40$\mu$ is necessary in consideration of an allowance for manufacturing error.

Approach of the P+ buried layer 4 to the P-type isolation region 6 due to its swell-up into the epitaxial layer 5 also results in lowering of the withstand voltage due to a punch-through between the P-type wall region 7 and the P+ buried layer 4 and between the P-type isolation region 6 and the P+ buried layer 3. For this reason, the gap b between the P+ buried layer 4 and the P-type isolation region 6 must be at least 42.5$\mu$ in consideration of an allowance for manufacturing error.

As described above, because the occupying area increases due to deep diffusion of the P-type isolation region 6 and the like and an allowance must be provide to prevent lowering of the withstand voltage due to punch-through, the conventional vertical PNP transistor inevitably occupies a large area on an integrated circuit.

Figure 3:
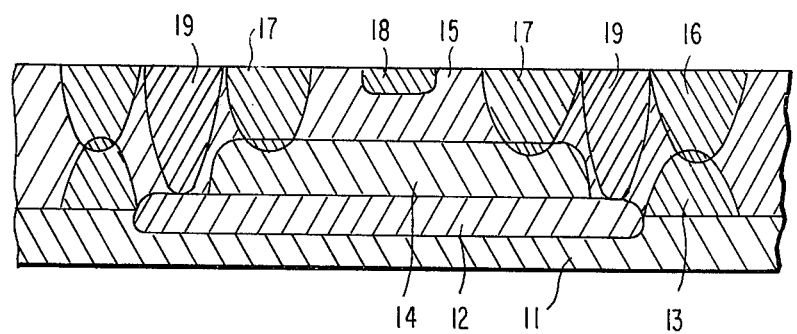
FIG. 3 is a sectional view showing a vertical PNP transistor in accordance with an embodiment of the present invention.

In accordance with the structure shown in FIG. 3, a vertical PNP transistor having a sufficiently high withstand voltage and occupying a small area can be obtained. Namely, an N+ buried layer is formed by diffusing antimony into a P-type silicon substrate 11 having resistivity of 20 to 40 Ohm.cm. and P+ buried layers are further formed by diffusing boron. At least one of the P+ buried layers is formed while it perfectly overlaps the N+ buried layer. This overlapping P+ buried layer will serve as the collector of the vertical PNP transistor. The other P+ buried layer is disposed at a position corresponding to the isolation region 6 that divides an epitaxial layer 15 to be later formed into plural island regions.

Next, vapor growth of an N-type silicon epitaxial layer 15 having resistivity of 10 to 15 Ohm.cm. and a thickness of 25 to 30$\mu$ is effected over the entire portion. During this vapor growth process, the P+ and N+ buried layers that have already been formed swell up into the epitaxial layer 15, thereby providing an N+ buried layer 12 having layer resistance of 20 to 40 ohm/□ and P+ layers 13, 14 having layer resistance of 300 Ohm/□, as shown in FIG. 3.

Next, boron is diffused for a short time into the annular or other closed-loop portion above the P+ buried layer 14 and into the portion above the P+ buried layer 13 on the surface of the epitaxial layer 15 and subsequently, phosphorous is annualy diffused for a short period into the surface of the epitaxial layer 15 above the N+ buried layer 12 positioned outside the P+ buried layer 13 in such a manner as to encompass the above-mentioned annular portion. Thereafter, heat treatment is effected at 1200° C., for about 20 hours to further diffuse boron and phosphorous that are diffused for a short time by the above-mentioned pre-deposition treatment. As a result, there are simultaneously formed a P+ isolation region 16 that comes into contact with the P+ buried layer 13 and isolates the epitaxial layer 15 into plural island regions, an annular or closed-loop P-type wall region 17 that separates the portion of the epitaxial layer on the P+ buried layer 14 from other regions, and an N+ annular region 19 that is interposed between the P-type isolation region 16 and the P+ wall region 17 and comes into contact with the N+ layer. The P+ wall region 17 and the N+ region 19 are not limited to an annular ring-like shape but can be designed to other shapes forming a closed-loop.

The thickness of the diffusion depth of each of the P+ isolation region 16 and the P-type wall region 17 is different from that of the N+ annular region 19 and this is due to the difference in the diffusion coefficients between boron and phosphorous. The surface impurity concentration is selected to be $5 \times 10^{19} \text{cm}^{-3}$ for all of the former regions 16, 17 and the latter region 19. The impurity concentration of the N+ annular region 19 becomes lowest at the portion where the region 19 comes into contact with the N+ buried layer 12 and the impurity concentration at this portion is so selected as to become at least three times that of the N-type epitaxial layer 15. The P-type annular wall region 17 has an inner diameter of about 120μ and an outer diameter of 140μ while the N+ annular region 19 has an inner diameter of 160μ and an outer diameter of 200μ. As a result, the regions 16, 17, 19 are separated from one other by about 10μ, but they may be overlapped with one another in order to reduce the element area. In this case, however, a design must be made so that the impurity concentration sufficiently raises the breakdown voltage of the PN junction formed by overlap. When the overlap design is employed, the surface impurity concentration of the N+ annular region 19 is so selected as to become lower than that of the P+-type isolation region 16.

Next, a P-type emitter region 18 having a surface impurity concentration of $1 \times 10^{17} cm^{-3}$ and a diameter of 30μ is formed at the portion of the epitaxial layer 15 or encircled within the P-type annular region 17.

Though NPN transistors and diffusion resistors are simultaneously formed on the other island regions of the epitaxial layer 15 by the abovementioned impurity diffusion process, they are not hereby discussed because they can be formed by ordinary techniques for forming integrated circuit.

The semiconductor element formed in the abovementioned manner can be used as a vertical PNP that uses the epitaxial layer 15 on the P+ buried region 14 as the base, the P-type emitter region 18 as the emitter and the P+ wall region 17 as well as the P+ buried region 14 as the collector. Incidentally, it is also possible to delete the P-type emitter region 18 and to form a diode by means of the epitaxial layer 15 formed on the P+ buried region 14, the P+ *wall region* 17 and the P+ buried region 14. It is further possible to form an N+ region inside the P-type emitter region 18 and to use the element as a PNPN thyristor.

In accordance with the present invention, the N+ annular region 19 exists between the P+-type isolation region 16 and the P+ wall region 17. Accordingly, there is no possibility that the P+ isolation region 16 and P+ wall region 17 are electrically short-circuited even when the gap between them is reduced. For this reason, it is possible to markedly reduce allowances for the manufacturing error and for the swell-up of the buried regions as discussed earlier, and to reduce the element area. Even when the gap between the P+ isolation region 16 and the P+ wall region is reduced, the depletion layer occurring at the junction between the P+ wall region 17 and the epitaxial layer 15 around its outer circumference does not reach the P+ isolation region 16 because of the high impurity concentration of the N+ annular region 19. In other words, since punch-through between the P+ wall region 17 or the P+ buried layer 14 and the P+ isolation region 16 does not occur even with a considerably high voltage, the withstand voltage between them becomes also high. The withstand voltage between them is primarily limited by the breakdown voltage of the PN junction, which is somewhat lowered by the presence of the N+ annular region 19, but this breakdown voltage is higher than the punch-through voltage when the element area is reduced. It is thus possible to simultaneously reduce the element area and to improve the withstand voltage with respect to the substrate 11.

The conventional device of this type involves the drawback in that the surface of the N-type epitaxial layer 5 between the P+ isolation region 6 and the P+ wall region 7 forms an inversion channel due to a voltage applied to the wiring disposed on the surface of the epitaxial layer 5 or the like and a leakage current flows from the P+ wall region 7 to the P+ isolation region 6. In accordance with the present invention, since the N+ annular region 19 exists at this portion, the inversion channel is not formed. Accordingly, the leakage current flowing from the P+ wall region 17 to the P+ isolation region 16 becomes extremely small.

Furthermore, since the P+ isolation region 16, the P+ wall region 17 and the N+ annular region are simultaneously formed with one another, there is hardly any increase in the number of fabrication steps. Especially when a power NPN transistor is formed on the same integrated circuit, an N+ region for reducing a collector resistance is so formed from the surface of the epitaxial layer as to reach the N+ buried layer, and there is no increase at all in the number of fabrication steps.

As described in the foregoing, it is possible in accordance with the present invention to fabricate an element having a high withstand voltage with respect to the substrate but occupying a small area.

What is claimed is:

1. A semiconductor device comprising:
   a semiconductor substrate (11) of one conductivity type;
   a semiconductor layer (15) of the other conductivity type;
   an isolation region (13, 16) of said one conductivity type formed as a closed-loop to isolate a portion of said semiconductor layer from other portions of said semiconductor layer, said isolation region penetrating said semiconductor layer to reach said semiconductor substrate;
   a first buried layer (12) of said other conductivity type formed in the vicinity of the interface between said semiconductor substrate and the isolated portion of said semiconductor layer;
   a second buried layer (14) of said one conductivity type formed in the vicinity of the interface between said first buried layer and said isolated portion of said semiconductor layer;
   a first region (17) of said one conductivity type formed as a closed-loop to isolate a part of said isolated portion from other parts of said isolated portion, said first region extending from the outer surface of said isolated portion to the interface between said isolated portion and said second buried region;
   a second region (19) of said other conductivity type formed in said isolated portion between said isolation region and said first region, said second region extending from the outer surface of said isolated portion to said first buried region, having an upper portion overlapped with said isolation region and said first region and having an impurity concentration higher than the impurity concentration of said semiconductor layer.

2. A semiconductor device as claimed in claim 1, said semiconductor device further comprising a third region (18) of said one conductivity type formed in said isolated part of said semiconductor layer, whereby said second buried layer, said first region, said isolated part and said third region form a transistor.

3. A semiconductor device as claimed in claim 2, wherein said second region has an impurity concentration at least three times that of the impurity concentration of said semiconductor layer.

4. A semiconductor device as claimed in claim 1, wherein said isolation region has an upper part (16) and a lower part (13), said upper part extending from the outer surface of said semiconductor layer, said lower part rising from the interface between said semiconductor layer and said semiconductor substrate, and said upper part and said lower part contacting with each other in said semiconductor layer.

5. A semiconductor device as claimed in claim 4, wherein said second region has an impurity concentration at its outer surface lower than that of said upper part of said isolation region.

6. A semiconductor device as claimed in claim 1, wherein said second region has an impurity concentration at least three times that of the impurity concentration of said semiconductor layer.

7. A semiconductor device as claimed in claim 1, wherein said second region has an impurity concentration at its outer surface lower than that of said isolation region.

* * * * *

UNITED STATES PATENT AND TRADEMARK OFFICE
CERTIFICATE OF CORRECTION

PATENT NO. : 4,476,480

DATED : October 9, 1984

INVENTOR(S) : Mamoru FUSE

It is certified that error appears in the above-identified patent and that said Letters Patent is hereby corrected as shown below:

IN THE SPECIFICATION:

Column 2, line 40, delete "direction".

Column 5, line 20, after "is" insert --formed in--;

line 21, after "formed" insert a --.--;

line 22, change "this" to --This--;

line 60, before "an" insert --of--; same line, delete "the";

line 62, before "layers" insert --buried--.

UNITED STATES PATENT AND TRADEMARK OFFICE
CERTIFICATE OF CORRECTION

PATENT NO. : 4,476,480            Page 2 of 2

DATED : October 9, 1984

INVENTOR(S) : Mamoru FUSE

It is certified that error appears in the above-identified patent and that said Letters Patent is hereby corrected as shown below:

Column 6, line 36, before "layers" insert --buried--, line 56, before "region" insert --or closed-looped--;

line 58, before "layer" insert --buried--.

Column 7, line 24, before "or" insert --encompassed by--.

Signed and Sealed this

Ninth Day of July 1985

[SEAL]

Attest:

DONALD J. QUIGG

*Attesting Officer*      *Acting Commissioner of Patents and Trademarks*